United States Patent [19]

Tabei

[11] Patent Number: 4,514,755
[45] Date of Patent: Apr. 30, 1985

[54] SOLID-STATE COLOR IMAGER WITH TWO LAYER THREE STORY STRUCTURE

[75] Inventor: Masatoshi Tabei, Kanagawa, Japan

[73] Assignee: Fuji Photo Film Co., Ltd., Kanagawa, Japan

[21] Appl. No.: 559,074

[22] Filed: Mar. 6, 1984

Related U.S. Application Data

[60] Division of Ser. No. 512,051, Jul. 8, 1983, Pat. No. 4,443,813, which is a continuation-in-part of Ser. No. 330,921, Dec. 15, 1981, abandoned.

[51] Int. Cl.³ .............................................. H04N 9/07
[52] U.S. Cl. ........................................ 358/44; 358/43
[58] Field of Search ...................... 358/41, 43, 44, 46, 358/47, 48; 250/211 J

[56] References Cited

U.S. PATENT DOCUMENTS

| | | | |
|---|---|---|---|
| 3,617,753 | 11/1971 | Kato | 358/44 |
| 3,971,065 | 7/1976 | Bayer | 358/41 |
| 3,984,721 | 10/1976 | Sato | 358/46 |
| 4,047,203 | 9/1977 | Dillon | 358/44 |
| 4,214,264 | 7/1980 | Hayward | 358/44 |
| 4,315,279 | 2/1982 | Kuwayama | 358/44 |
| 4,441,123 | 4/1984 | Ochi | 358/44 |

Primary Examiner—Tommy P. Chin
Attorney, Agent, or Firm—Sughrue, Mion, Zinn, Macpeak, and Seas

[57] ABSTRACT

A solid-state color imager comprised of a solid-state base comprised of a plurality of electrical switching elements said base further including photosensitive elements associated with some of the switching elements arranged in sets having superimposed thereon a plurality of photosensor layers which can detect and absorb different colors of light. Each photosensitive layer is comprised of an upper transparent continuous electrode sublayer, a photoconductive sublayer, and a back mosaic transparent electrode sublayer which is electrically connected to said base. When light strikes the outermost photosensitive layer, light of a particular color is absorbed, and in connection with said base, its presence is electrically detected and recorded. The unabsorbed light continues to travel and strike the next succeeding photosensor layer whereat another color of light is absorbed and detected. The unabsorbed light passing through the second photosensor layer strikes the photosensitive elements of the base which detect the remaining light. The photosensor layers are electrically insulated from each other and the base and in connection with the photosensitive elements of the base make possible detection of three separate colors of light such as blue, green and red without the use of multi-color filter arrays, although in some embodiments a monocolor filter is used.

12 Claims, 17 Drawing Figures

SOLID-STATE COLOR IMAGER WITH TWO LAYER THREE STORY STRUCTURE

This is a division of application Ser. No. 512,051, filed July 8, 1983, now U.S. Pat. No. 4,443,813, which is a continuation-in-part of application Ser. No. 330,921 filed Dec. 15, 1981, now abandoned.

RELATED APPLICATIONS

This application is related to my two copending applications entitled "Solid-State Color Imager With Stripe or Mosaic Filters", Ser. No. 330,927 filed Dec. 15, 1981, now U.S. Pat. No. 4,404,586, and "Solid-State Color Imager With Three Layer Four Story Structure", U.S. Pat. No. 4,438,455, filed July 8, 1983, which is a Continuation-In-Part of application Ser. No. 330,928 filed Dec. 15, 1981 and now abandoned.

FIELD OF THE INVENTION

The invention relates to solid-state color image sensors, and more particularly to a solid-state color image sensor which utilizes a plurality of photosensor layers superimposed over a solid-state base comprised of CCD, MOS, MNOS or the like devices making it possible to eliminate the need for multi-color filters.

BACKGROUND OF THE INVENTION

A well-recognized goal within the field of solid-state color image sensors is the production of a solid-state color imager which is highly sensitive to light, and which produces a clear image while being inexpensive to manufacture. In pursuit of this goal, a number of different types of solid-state color imagers have been produced.

In one such imager, panchromatic image sensing elements in an array are selectively sensitized to color by means of an integral array of color filters disposed over the array of image sensing elements. Highly efficient configurations for such filter arrays which maximize the amount of usable inforhave been described for example in U.S. Pat. No. 3,971,065 issued July 20, 1976 to Bayer and U.S. Pat. No. 4,047,203 issued Sept. 6, 1977 to Dillon. However, the resolution capabilities inherent within such arrays are limited by the number of sensing elements that can be placed on the array and are further limited in that only a portion of each element in the array contributes to the resolution of fine detail. Consequently, the spatial resolution of such integral-filter color image sensing arrays, while optimized for the particular design, will not be as high as monochrome image sensing arrays of the same number of elements.

Another structure as proposed within British Pat. No. 2,029,642 and Japanese Patent Applications Nos. 55-39404; 55-277772; 55-277773; and 51-95720 is constructed such that the photosensor is superimposed on top of the information transfer device or solid-state base which is capable of a switching function. The base may be an MOS or CCD switching device. Such devices are described in detail within British Pat. No. 2,029,642 the disclosure of which is incorporated herein by reference. Such structures have potentially high sensitivity due to a larger sensing area than is present within conventional imaging devices where the photosensor is located on the same level as the information transfer device. However, such devices must utilize multi-color filters and the loss of resolution is comparable to normal solid-state imagers as discussed above. In addition, to Produce such a structure, the color filters must be arranged in a particular pattern on the image sensing element which creates difficulty in the alignment and bonding of the filters making the production of such devices complex and expensive.

Improvements over the structure disclosed in the aforementioned British Patent are described in European Pat. No. 0046396 and Japanese Patent Application No. 56-133880. The improved structure in the European Patent uses three MOS elements on the solid-state base for each image sensing element. The photo-carrier generated in a photoconductive layer is applied to the gate of an amplifying MOS as compared to the drain or source in the British Patent which in turn is connected to a switching MOS transistor. The third MOS transistor provides a means for resetting the photoelectric conversion elements. Solid-state color imagers with this structure improve resolution and signal-to-noise ratios by preventing picture cells which are not being scanned from providing false signals.

The improved structure in the Japanese Patent Application No. 56-133880 uses a Metal Nitride Oxide Silicon Semiconductor (MNOS) field effect transistor for detecting and storing data for photosignals, as electrical signals. Similarly to the European Patent described above, the photosignal is applied to the gate of the transistor. Solid-state color imagers with this structure give rise to a nonvolatile memory effect which results from the use of the MNOS semiconductors.

Both of the devices described in the European Patent and Japanese Application No. 56-133880 must still use multicolor filters arranged in a particular pattern on the image sensing element.

A technique for eliminating color filters in a vidicon is taught in U.S. Pat. No. 3,617,753 of Kato et al. The vidicon includes a conventional semiconductor layer having a substrate on a plurality of p-n diodes which store electrical signals representing light intensity. An electron beam scans the p-n diodes to provide video read out. By stepping the thickness of the semiconductor substrate through which the light passes to the p-n diodes, different wavelength light impinges on the p-n diodes, depending on the size of the step. In this manner different groups of p-n diodes can store different color light. Alternatively the p-n diodes can be formed at varying depths from the surface, thereby effectively stepping the thickness of the substrate. In another embodiment, solid state scanning can be provided instead of electron beam scanning. There a junction device and a MOS element is provided at each pixel and selective etching of the substrate results in varying distances between the light receiving surface of the semiconductor substrate and the junction device of the pixel. The apparatus disclosed is not planar due to the stepped or cutout arrangement and does not have the advantage provided by systems using photoconductors as the light responsive element.

A solid-state color image sensing array has been developed wherein the potential resolution is equal to that of a monochrome array of the same size. Such a sensing array has a plurality of superimposed channels (e.g., three superimposed channels for a three-color device) wherein each channel has a different spectral response due to differential absorption of light by a semiconductor material. (See Research Disclosure, August 1978, Vol. 172, Disclosure No. 17240 entitled: "Color Responsive CCD Imager" available from Industrial Opportunities, Ltd., Honeywell, Havant, Hampshire P091EF, U.K.) However, extremely complex and expensive processes are necessary to produce such devices due to the necessity of superimposing the three channels. When utilizing the CCD (charge-coupled device), the channels which carry the information signal must be carefully constructed within precise limitations making the construction complicated and expensive. Although it is possible to produce a single channel on a substrate, it is complicated and difficult to superimpose additional channels thereon.

Devices such as those described in Disclosure No. 17240 indicate that it is possible to produce multiple superimposed varied channels in silicon crystal which can act as multi-channel superimposed color-sensing devices. However, in addition to the expense and complication of their manufacture, as mentioned above, the color separation and selectivity of these devices is poor due to the inherent limitations of the materials used. The materials used in making such devices act as CCD channels which must have good single crystalline properties as well as color selective photosensors.

As mentioned above, there exists a need within the field for a solid-state color imager which is highly sensitive to light and which gives sharp, detailed resolution of the image. By utilizing a device wherein the multi-colored filters are superimposed over the image-sensing elements in an array, the resulting image, as described within U.S. Pat. No. 3,971,065, has limited resolution capabilities, limited sensitivity and is complicated and expensive to produce due to the necessity of precisely placing the multi-color filters. Increased sensitivity can be obtained by utilizing a device wherein a photosensor is superimposed on top of the information transfer device, as described within British Pat. No. 2,209,642, European Pat. No. 0046396 or Japanese Application No. 56-133880. However, resolution of such devices is still somewhat limited because they require the use of multi-color integral filters which also increases the complexity and expense of their production. By utilizing a device having a sensing array of a plurality of superimposed channels, it is possible to obtain a resolution equal to that of a monochrome array. However, complex, expensive manufacturing techniques must be utilized to superimpose three channels on top of each other.

The present invention utilizes a plurality of photosensitive layers which are superimposed on each other and over the base which includes image sensing elements which are used for detecting a single color of light. The invention eliminates the need for multi-color integral filters since each photosensitive layer and the elements on the base of each detects a different color of light. The device has a resolution equal to that of a monochrome array of the same size and can be produced by simple, conventional, inexpensive techniques.

SUMMARY OF THE INVENTION

The present invention provides a solid-state color imager which can be produced using simple, inexpensive conventional techniques such as conventional vacuum deposition or sputtering techniques. The device is highly sensitive to light and produces an image having desirably high resolution considering the characteristics of the human eye. The light sensing area for a majority of the individual color elements in the matrix is greater than for the corresponding elements of an imager using a single photoconductor layer with a multi-color filter. Also, the image resolution is comparable to that of a conventional monochromatic solid-state imager with the same number of elements.

The invention is comprised of a solid-state base having switching elements for handling electrical charges, with photosensing elements also on the base. A plurality of photosensor layers are superimposed on the base for absorbing and detecting light. The solid-state base may be any type of two-dimensional information device such as a Charge Coupled Device (CCD), Metal Oxide Semiconductor (MOS) matrix switching device or Metal Nitride Oxide Silicon Semiconductor (MNOS) matrix switching device. The base carries out switching and transfer functions in connection with the photosensitive layers and the photosensing elements of the base itself. The photosensor layers which are superimposed on each other over the base are each comprised of three sublayers including an upper continuous transparent electrode layer, a transparent mosaic pattern of back electrodes with a photoconductive sublayer positioned therebetween. The back electrodes on each of the layers, as well as the photosensors on the base, are electrically connected with the switching elements on the solid-state base, e.g., to the gate, source or drain terminals depending on the type and arrangement of base switching devices used. Each of the photosensor layers is electrically insulated from the other layer and from the solid-state base at all points other than via the electrical connections.

It is a primary object of this invention to present a solid-state color imager comprised of a solid-state base which includes photosensitive elements and has a plurality of photosensor layers superimposed thereon such that each layer and the photosensing elements of the base are electrically connected to terminals on the base making it possible to read out electrical charges received from the photosensors, with each succeeding photosensor layer being sensitive to and absorbing a broader band of light, allowing the photosensors of the base to detect only the light passing through the upper layer.

Another object of the invention is to present a solid-state color imager which can be produced without the need of multicolor filters.

Still another object of the invention is to present a solid-state color imager which is highly sensitive to light.

Yet another object of this invention is to present a solid-state color imager which can produce an image with high resolution.

Another object of this invention is to present a solid-state color imager which can be produced in a simple and inexpensive manner.

These and other objects and advantages of the present invention will become apparent to those skilled in the art upon reading the details of construction and usage as more fully set forth below, reference being made to the accompanying drawings forming a part hereof wherein like numerals refer to like parts throughout.

DESCRIPTION OF THE PREFERRED EMBODIMENTS

Before the present solid-state color imager is described, it is to be understood that this invention is not limited to the particular arrangement of components shown, as such devices may vary. It is also to be understood that the terminology used herein is for purposes of describing particular embodiments, and is not intended to be limiting.

Figure 1:
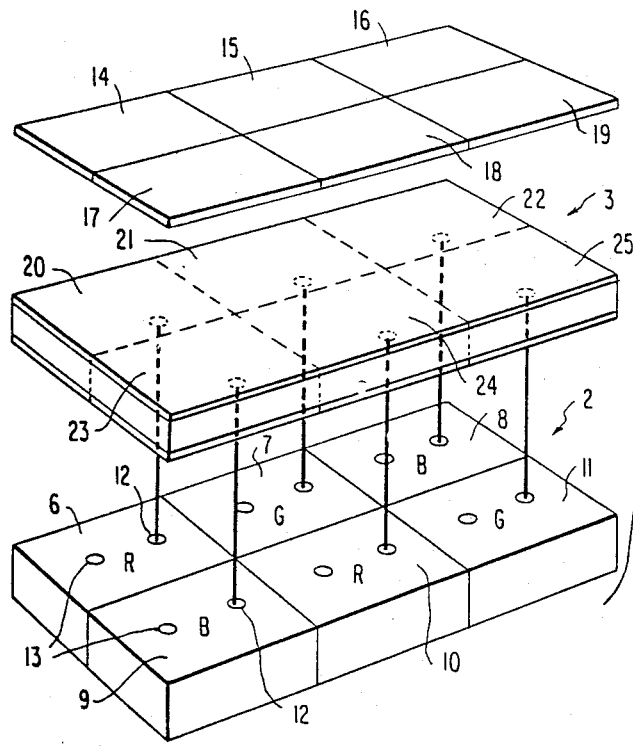
FIG. 1 is an exploded perspective view of a conventional solid-state color imager showing a photoconductive layer superim:posed on a base.

Referring now to FIG. 1, a conventional solid-state color imager, of the type having a photosensitive element superimposed on the base can be described. FIG. 1 is an exploded perspective view of a conventional solid-state color imager. The base 2 has a photosensitive layer 3 superimposed thereon. The base 2 includes a plurality of MOS switching elements 6, 7, 8, 9, 10 and 11. FIG. 1 shows only a portion of what such an imager includes. In reality, the imager includes thousands of MOS elements. The elements 6, 7, 8, 9, 10 and 11 are utilized for various switching and transfer functions in connection with, for example, red, green, blue, blue, red and green light, respectively. Each of the elements 6-11 includes a source terminal 12 and a drain terminal 13.

The photosensitive layer 3 is comprised of three sublayers which are described further below. The bottom sublayer or back mosaic electrodes on the bottom or innermost sublayer of the layer 3 are all electrically connected to elements 6-11. Superimposed over the photosensitive layer 3 are filter elements 14, 15, 16, 17, 18 and 19 which correspond respectively to elements 6, 7, 8, 9, 10 and 11. The filter elements 14-19 are utilized to filter out all light except a single color of light. Accordingly, for example, the filter 14 is utilized to filter out all light except red light; the filter 15 filters out all light except green light; and the filter 16 filters out all light except blue light, etc., in correspondence with the switching and transfer functions of elements 6-11 mentioned above.

Since the photosensing function within the layer 3 is separated from the switching and transfer function within the base 2, the device as shown within FIG. 1 is significantly more sensitive to light than prior art devices wherein the photosensing function was carried out at the same level as the switching and transfer functions. However, the device as shown within FIG. 1 still requires the use of the multi-color filters 14-19 and such filters require precise placement making the construction of the device somewhat expensive. The filters 14-19 are utilized to filter out light before it reaches the photosensitive areas 20, 21, 22, 23, 24 and 25 which are defined by their respective back electrodes.

The combination of each of MOS elements 6-11, photosensitive areas 20-25 and filters 14-19 forms what are referred to in the art as pixels. Accordingly, the portion of the device as shown within FIG. 1 shows six pixels. Applicant's invention is capable of producing a device utilizing the same size base 2 which includes six pixels, or what is described below as two pixel sets, while eliminating the need for the multi-color filters.

Figure 2:
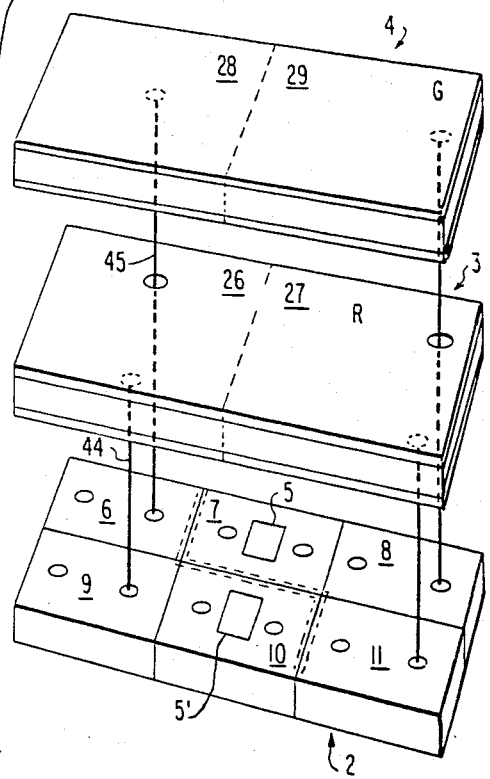
FIG. 2 is an exploded perspective view of the solid-state color imager of the present invention showing the two-layer, three-story construction.

Referring now to FIG. 2, wherein an exploded perspective view of the present invention is shown, the imager includes a base 2 having MOS elements 6, 7, 8, 9, 10 and 11 positioned thereon. Photosensitive layers 3 and 4 are superimposed on the base 2. Each layer 3 and 4 is comprised of sublayers which are described in more detail with reference to FIG. 3. Photodiodes 5 and 5' are positioned on the base 2 associated with MOS elements 7 and 10, respectively. FIG. 2, like FIG. 1, shows only a small portion of the imager which is made up of thousands of similar portions. By arranging the layers 3 and 4 and photodiodes 5 and 5' in the manner shown in FIG. 2, it is possible to detect three separate color bands of light without using multi-color filters such as those shown in FIG. 1.

The layer 3 includes photosensitive elements 26 and 27; and layer 4 includes photosensitive elements 28 and 29. Each of the elements 26-29 is connected to one of the MOS elements of the base 2 and each photodiode 5 and 5' is associated with an MOS element on the base 2. The elements 26 and 28 are superimposed over each other as are elements 27 and 29, and the layers 3 and 4 cover all photodiodes on the base 2. Although it is easier to understand the present invention if the layers 3 and 4 are described as consisting of photosensitive elements, 28, 29, etc., it should be understood that in each layer the top electrode sublayer and the photoconductive sublayer may be, and preferably are, continuous layers (except for the via holes). The bottom mosaic electrode sublayer is not continuous and it defines the metes and bounds of each photosensitive element. Each of the layers 3 and 4 not only detect a given color of light but absorb that color. Accordingly, two colors, e.g., blue and green are detected and absorbed and a single color, e.g., red strikes elements 5 and 5'.

The elements 26 and 28 are connected respectively to MOS elements 9 and 6. The combination of MOS elements 9 and 6 with photosensitive elements 26 and 28 above the base 2 and photodiode 5' on base 2 associated with MOS element 10, comprise what is referred to as a pixel set. Two pixel sets are shown within FIG. 2. Each pixel set is capable of detecting three separate colors of light. The MOS elements are shown in FIG. 2 arranged in L-shaped patterns. However, it should be noted that the MOS elements can be arranged in any number of different patterns, such as linearly or square patterns and can be connected to the back electrodes in a variety of different ways. The area 28 is connected to base 2 via connection 45 and the area 26 is connected to base 2 via connection 44.

Figure 3:
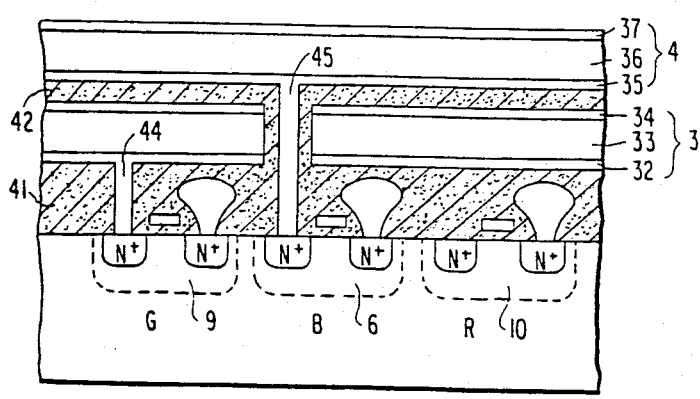
FIG. 3 is a longitudinal cross-sectional view of the solid-state color imager of the present invention.

Referring now to FIG. 3, which is a longitudinal cross-sectional view of the imager of the invention, details of the layers 3 and 4 can be given. As indicated above, each of the photosensitive layers 3 and 4 is comprised of three sublayers. The layer 3 includes sublayers 32, 33 and 34, and the layer 4 includes sublayers 35, 36 and 37. The layer 3 is insulated from the base 2 by insulation material layer 41. The layer 3 is insulated from the layer 4 by insulation material layer 42. Accordingly, each of the layers 3 and 4 are insulated electrically from each other and from the base 2 at all points other than via the electrical connections 44 and 45.

The photosensitive layer 3 includes a top transparent electrode sublayer 34 and a bottom transparent mosaic electrode sublayer 32. A sublayer 33 of a photoconductive material is positioned between the sublayers 32 and 34. The layer 4 includes components similar to the layer 3. The bottom mosaic electrode sublayers 32 and 35 must be transparent. Furthermore, each of the layers 3 and 4 is constructed so as to be sensitive to and capable of absorbing different colors of light as described in detail in connection with FIGS. 5–5c.

By producing a device in the manner as shown within FIGS. 2 and 3, it is possible to eliminate the need for an array of integral multi-color filters. More specifically, the present invention does not require the configurations of filter arrays such as shown in FIG. 1 and disclosed within U.S. Pat. Nos. 3,971,065 and 4,047,203. Since the device does not require integral (multi-color) color filters on top of the solid-state device, the present invention can be constructed in a relatively simple manner at a relatively low cost.

The present invention can operate without the need for any filters. However, it is possible to utilize a single broad band type filter superimposed over the outermost photosensitive layer 4. Such a filter can be designed to filter out light not visible to the human eye, such as light having a wavelength of less than 4000Å or greater than 7700Å, i.e., ultraviolet or infrared light.

Figure 4:
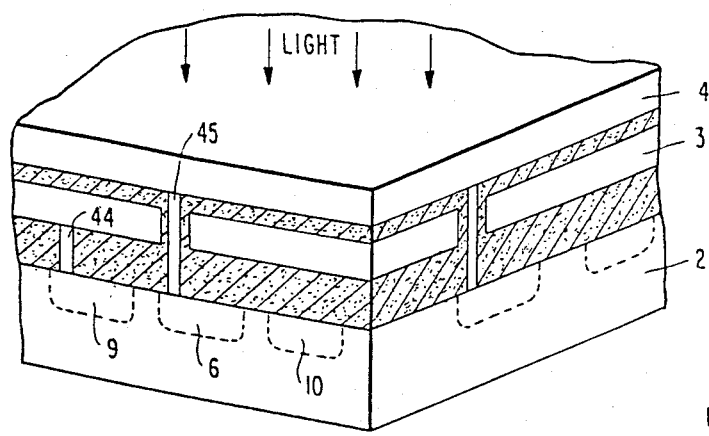
FIG. 4 is a schematic perspective view of the solid-state color imager of the present invention.

By referring now to FIG. 4, a perspective view of the imager of the present invention can be seen. As shown within FIG. 4, light strikes the top surface of the outermost layer 4. As described in detail below, some of the light is absorbed by layer 4 and the remainder of the light strikes the layer 3 where additional light is absorbed and the remaining light strikes the base 2. The photosensitive elements 5 and 5' are positioned on base 2 and are associated with MOS elements 7 and 10 as is well known in the art. Prior to the development of superimposed photosensor layer structure as shown in FIG. 1, an array of photodiode elements such as 5 and 5' were used as the sole light detecting means. As explained above, such a construction was not highly sensitive due to the small size of the photodiodes and such a construction still required the use of a multi-color filter array.

Figure 5:
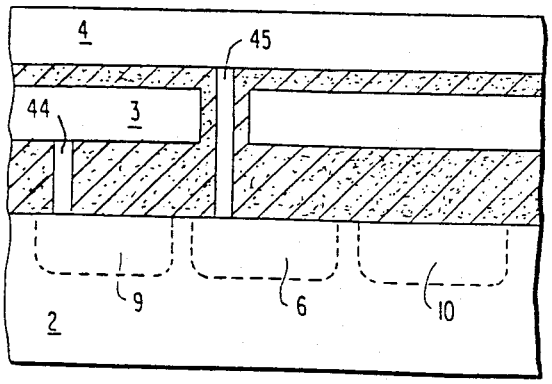
FIGS. 5, 5a, 5b and 5c are, respectively, a longitudinal cross-sectional view of the imager and graphs wherein the absorption versus wavelength has been plotted with respect to the light which is absorbed and sensed within the outermost, second and base layers of the imager.
Figure 5A:
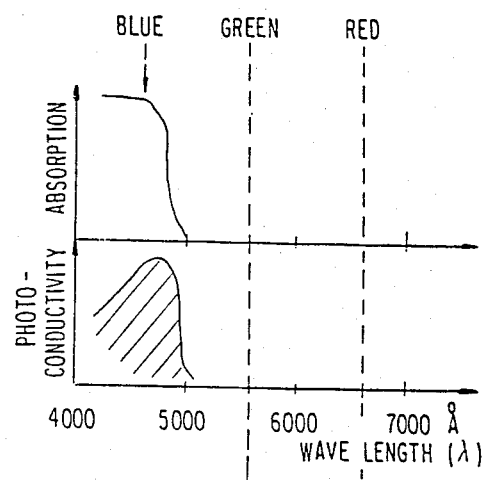
Figure 5B:
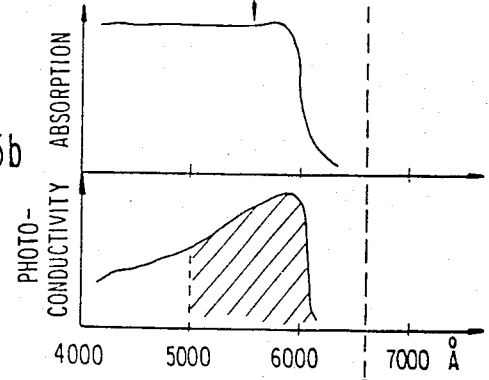
Figure 5C:
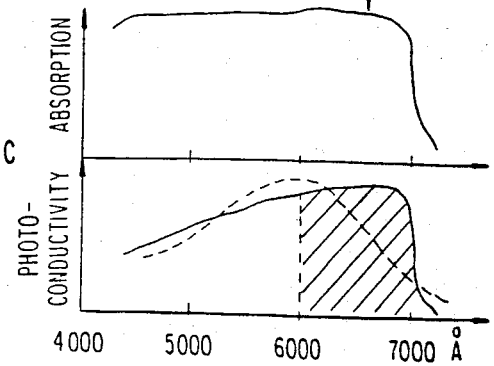

By referring to FIG. 5 in combination with FIGS. 5a–5c, the operation of the imager of the present invention can be described in detail. FIG. 5 is a longitudinal cross-sectional view of the device similar to that shown within FIG. 3, but showing less detail, e.g., the sublayers are not shown in FIG. 5. FIGS. 5a, 5b and 5c are respectively, graphs wherein both absorption and photoconductivity versus wavelength have been plotted with respect to light which is absorbed and sensed within layers 3 and 4 as well as light sensed by photosensitive elements 5 and 5' on base 2.

As light in the wavelength region to which the layer 4 is responsive strikes the layer 4, the resistance of the photoconductive sublayer 36, (see FIG. 3) at the particular element 28 (see FIG. 2) is reduced. The decreased resistance can be electrically detected and recorded by the utilization of the electrode sublayers 37 and 35 in connection with the MOS element 6 within the base 2.

The particular manner of recording the decrease in electrical resistance which is carried out in connection with the detection of light is not part of the present invention and is well known to those skilled in the art. The decreased resistance represents the intensity of blue light falling on the element 28 of the layer 4 (See FIG. 5a). Furthermore, as shown by the absorption curve of FIG. 5a, the layer 4 absorbs light only in the blue region. Light which passes through the layer 4 only contains the green and red portions of the spectrum. The layer 4 absorbs all light having a wavelength of 5000Å or less and allows the remainder of the light to pass through to layer 3. Furthermore, the layer 4 is sensitive to light having a wavelength of 5000Å or less.

As light in the wavelength region to which the layer 3 is responsive strikes the layer 3, the resistance of the photoconductive sublayer 33 (see FIG. 3) at element 26 (see FIG. 2), is reduced. The decreased resistance varies the current in the manner described above. Accordingly, green light falling on the region 26 can be detected in connection with the MOS device 9. As shown by the absorption curve for the layer 3, it also absorbs light in the green region. The material within the layer 3 will actually absorb blue and green light, but the blue light has been absorbed or filtered out by the layer 4. Therefore, by the combination of layers 3 and 4, all the blue and green light have been filtered out and only red light passes through. The layer 4 filters out light having a wavelength of 5000Å or less and is sensitive to light having a wavelength of 5000Å or less. However, since light having a wavelength of 5000Å or less has been filtered out by the layer 4, the layer 3 is only contacted by and therefore responsive to light having a wavelength of between 5000 and 6000Å, i.e., green light.

As shown within FIG. 5c, the photosensitive elements 5 and 5' of the base 2 absorb all visible light and are somewhat sensitive to all visible light. However, elements 5 and 5' are most sensitive to light in the red Portion of the spectrum. As explained above, the layer 4 has already absorbed the blue light and the layer 3 has already absorbed the green light. Accordingly, only red light falls on the base 2, thus striking elements 5 and 5'. As the red light strikes elements 5 and 5' the current is varied in the manner allowing for the detection of the light by means of electrical impulses.

By utilizing the layers 3 and 4 and elements 5 and 5', having the particular abilities of absorption and photoconductivity as explained above, it is possible to accurately perceive light striking any particular region of the imager and to determine the wavelength and thus color of the light striking that region. The intensity of the light striking any area of a layer or any photosensitive element can also be determined by the degree of change in resistance. The layers 3 and 4 are constructed so that small variations in resistance can be determined so that the relative intensity of the light of any particular wavelength (color) striking the imager can be detected and recorded via electronic means in connection with the base 2.

It is possible to construct the color imager disclosed herein in a variety of different embodiments. Although construction details are not shown, it will be apparent that the imager array can be constructed in the manner as shown within the above-referenced British Patent, with the variations necessary to accommodate two photoconductor layers plus openings therein for connecting the bottom electrodes of each photoconductive layer with the MOS devices on the semiconductor substrate. In addition, the base 2 must accommodate some photosensitive elements such as elements 5 and 5', and the construction and placement of such elements is well known in this art.

The embodiment shown within FIGS. 2, 3, 4 and 5, and explained in connection with FIGS. 5a–5c is considered to be the preferred embodiment of the invention. The upper layer 4 detects and absorbs blue light, the second layer 3 detects and absorbs at least green light, and the elements 5 and 5' detect at least red light. By constructing the layers 3 and 4 such that they are capable of detecting and absorbing light, they act as both sensors and filters. Therefore, the need for the multicolor filters which must be arranged in an integral array has been eliminated, while the ability of the device to detect different colors of light has been maintained.

The device as shown within FIG. 5 and described in connection with FIGS. 5a–5c can be constructed in different manners in order to obtain different end results. However, the embodiment as shown and described in connection with these Figures has been found to give desirable results. When constructing a device which is intended to operate in this manner, the insulating materials within the insulative layers as well as the material within each of the photosensitive layers must be constructed in a particular manner.

The insulative materials within layers 41 and 42 may be comprised of a number of electrically insulative materials such as $SiO_2$, $Si_3N_4$, polyimide, polyamide, photoresist or other known organic polymers.

The uppermost photosensitive layer 4 is sensitive to blue light and may be comprised of a material selected from the group consisting of CdS, ZnCdS or ZnSeTe. The layer 3, which is sensitive to and absorbs both blue and green light but which detects and absorbs only green light since the blue light has been filtered by the layer 4, may be constructed of amorphous selenium, CdSe, or GaAsP. The elements 5 and 5' are sensitive to blue, green and red light and absorb all colors of light. Since blue and green light have been filtered by layers 3 and 4, the layer only detects red light. The elements 5 and 5' may be constructed in a conventional manner known to those skilled in the art, and may be comprised of a material selected from the group consisting of GaAlAs, GaAsP, ZnCdTe, CdTe or amorphous silicon hydride.

Depending upon the particular type of photosensitive layers and elements which are utilized, and the use to which the device is to be put, different amounts of voltage can be used in the operation of the device. Furthermore, different voltages can be utilized in connection with each of the photosensitive layers and/or elements depending upon the particular results desired.

Figure 6:
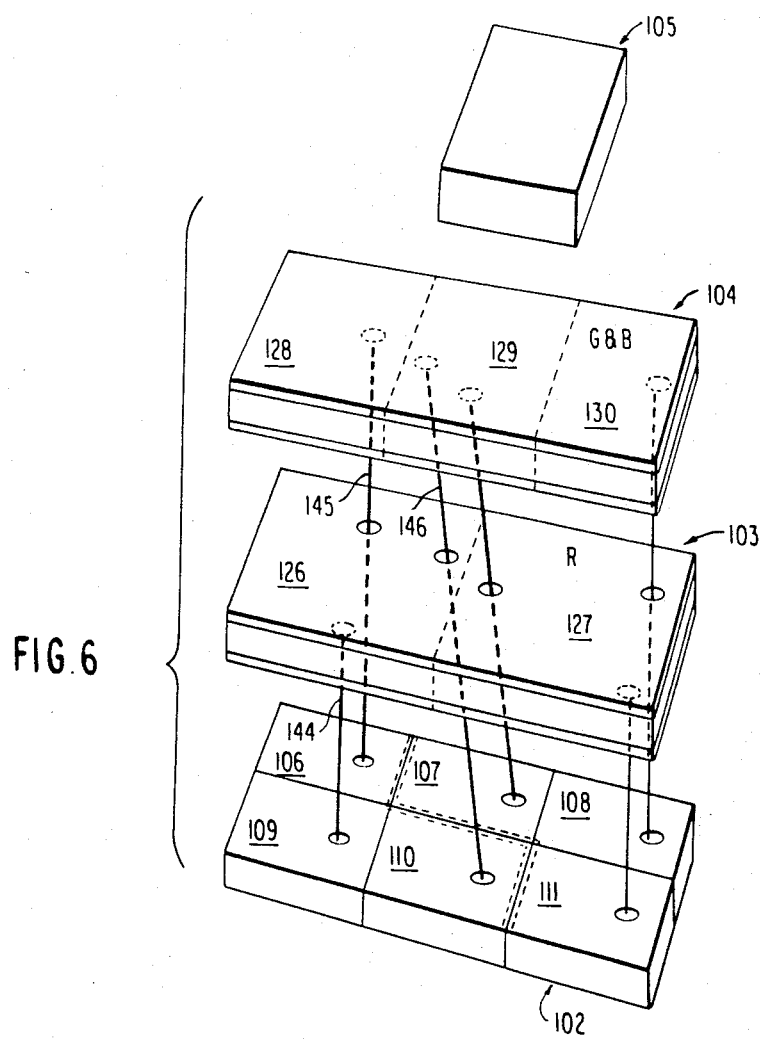
FIG. 6 is an exploded perspective view of another embodiment of the solid-state color imager of the present invention showing the two-layer, three-story construction with a monocolor filter.

In FIG. 6 there is shown an exploded perspective view of another embodiment of the present invention. The imager includes a base 102 having elements 106, 107, 108, 109, 110 and 111 positioned thereon. Each of the elements is comprised of one or more MOS or MNOS elements. Photosensitive layers 103 and 104 are superimposed on the base 102. Each of the layers 103 and 104 is comprised of similar sublayers as those described with reference to layers 3 and 4 and in FIG. 3. The photoconductive sublayer of the photosensitive layer 104, however, detects and absorbs both green and blue light and the photoconductive sublayer of the photosensitive layer 103 detects and absorbs red light. A monocolor filter layer 105 is superimposed over a portion of the photosensitive layer 104.

The layer 103 includes photosensitive elements 126 and 127; and layer 104 includes photosensitive elements 128, 129 and 130. Each of the elements 126–130 is connected to one of the elements of the base 102. The connection is made either to the gate, source or drain of one of the devices comprising the switching element. For example, when using the pixel taught by the British Pat. No. 2,029,642, the connection is made to the drain or source of the MOS device, when using the pixel taught by the European Pat. No. 0046396 the connection is made to the gate of the amplifying MOS device, and when using the pixel taught by the Japanese Application No. 56-133880 the connection is made to the gate of the MNOS device. The element 128 and a portion of the element 129 are superimposed over the element 126, and the element 130 and a portion of element 129 are superimposed over the element 127. The monocolor filter layer 105 is superimposed over the element 129.

The elements 126, 128 and 129 are connected respectively to elements 109, 106 and 110, and these connections comprise what is referred to as a pixel set. It should be noted that the element 129 is also connected to a second base element 107 in another pixel set. Two pixel sets are shown within FIG. 6. Each pixel set is capable of detecting three separate colors of light. The elements are shown in FIG. 6 arranged in L-shaped patterns. However, it should be noted that the elements can be arranged in any number of different patterns, such as linear or square patterns and can be connected to the back electrodes in a variety of different ways. In the pixel set comprised of base elements 106, 109 and 110 the element 126 is connected to base 102 via connection 144, the element 128 is connected to base 102 via connection 145 and the element 129 is connected to element 110 on base 102 via connection 146.

Although the photosensitive element 129 is shown in FIG. 6 to have two outputs connected from its back electrode to two different pixel sets, it should of course be appreciated that the element 129 could have two separate or distinct back electrodes with each electrode connected to a single pixel.

The embodiment of FIG. 6 is especially advantageous when using as switching elements 106–111 the type of switching elements disclosed in the above-cited European Pat. No. 0046396 or Japanese Patent Application No. 56-133880. In such a case, it is not possible to utilize photosensitive diodes 5 and 5' to detect red light, and the arrangement shown in FIG. 6 permits all three colors of light to be detected by only the two photoconductive layers, as will be more clearly explained with reference to FIGS. 7, 11(a) and 11(b).

Figure 7:
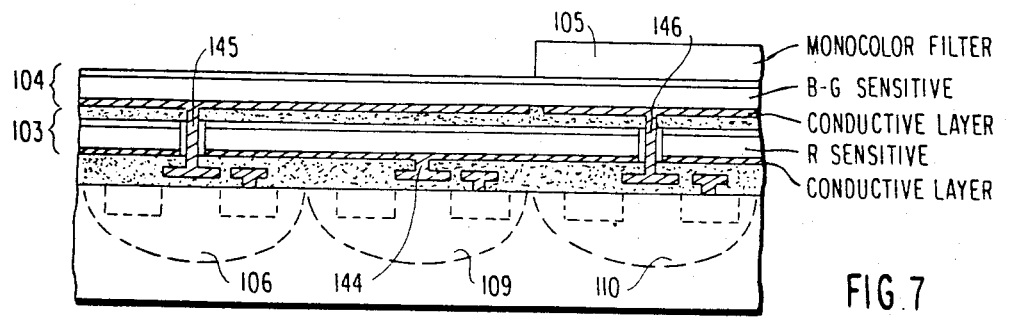
FIGS. 7-10 are longitudinal cross sectional views of the solid-state color imager of FIG. 6 with different types of switching elements.

FIG. 7 illustrates a longitudinal cross sectional view of the imager of this embodiment with details very similar to those described previously with reference to FIG. 3. In FIG. 7, the electrode sublayers of photosensitive layers 103 and 104 are shown connected to the gate of either an MOS or MNOS device which comprise pixels of the type disclosed in the European Patent or the Japanese Patent Application No. 56-133880. The monocolor filter 105 is shown superimposed over MOS or MNOS element 110. Light of a particular color is absorbed by the monocolor filter 105 and passed on to the photoconductive sublayer of photosensitive layer 104. As the light in the wavelength region to which the layer 104 is responsive strikes the layer 104, the resistance of the photoconductive sublayer is reduced. The decreased resistance can be electrically detected and recorded by the utilization of the electrode sublayer of the photosensitive layer 104 in a similar manner as that which has been Previously described with regard to FIG. 3.

In FIG. 7, the photoconductive sublayer of the photosensitive layer 104 detects and absorbs blue and green light. However, that portion of the photosensitive layer 104 which is covered by the monocolor filter 105 will not be able to detect and absorb both blue and green light if the filter is designed to discriminate between these colors. That portion of photosensitive layer 104 which is not covered by the monocolor filter 105 will, however, be capable of absorbing and detecting both blue and green light. The photoconductive sublayer of the photosensitive sublayer 103 detects and absorbs red light, so that as light in the wavelength region of red light strikes the layer 103 the resistance of the photoconductive sublayer is reduced. Therefore, in much the same manner as has already been described, the elements 106, 109 and 110 form a pixel set and are able to detect three colors.

Figure 11A:
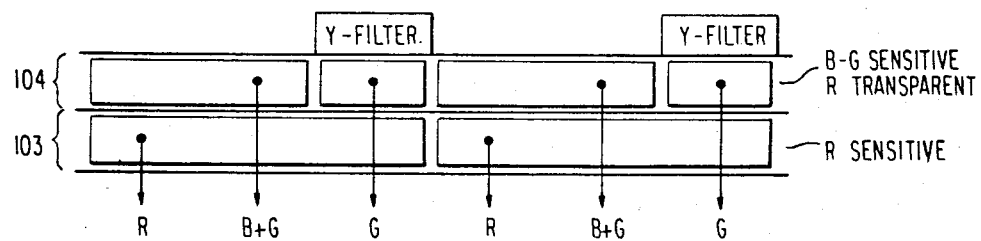
FIGS. 11a-11d are schematic representations of the operation of the solid-state color imager of FIG. 6 with various monocolor filters.
Figure 11B:
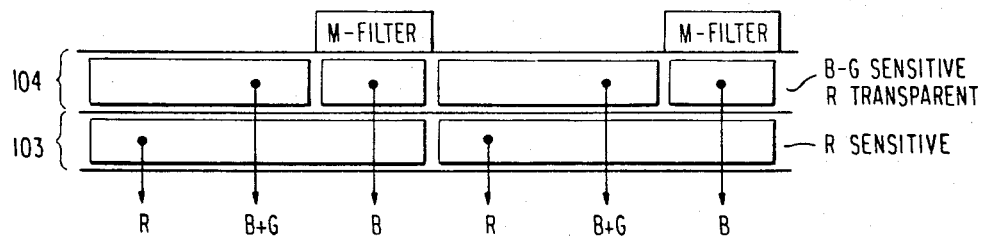

FIGS. 11(a) and 11(b) illustrate two different ways of detecting all three colors with the embodiment of FIG. 7. In FIG. 11(a), the monocolor filter 105 is a yellow filter so that the portion of the sublayer 104 underlying the monocolor filter will detect green light. The three signals R, B+G and G will permit all colors to be detected. In FIG. 11(b), a magenta filter is used, and the portion of the sublayer 104 underlying the monocolor filter 105 will therefore detect blue light. The three signals R, B+G and B can similarly be combined to detect all three color components.

Figure 9:
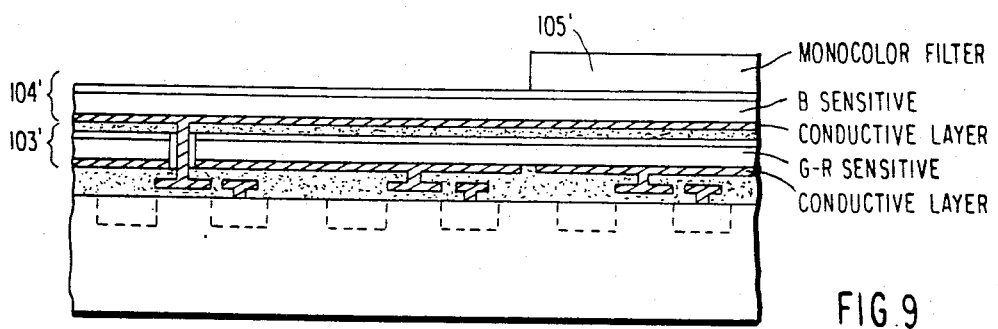
Figure 11C:
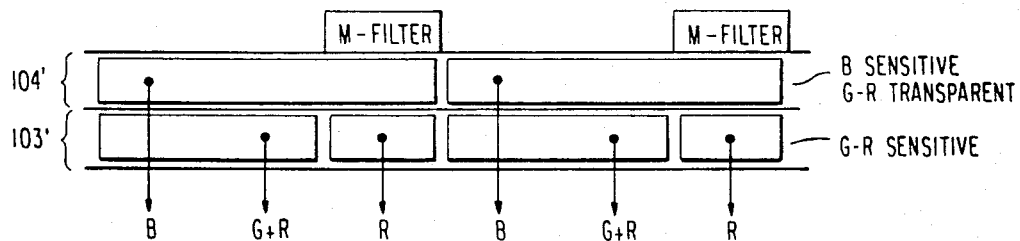
Figure 11D:
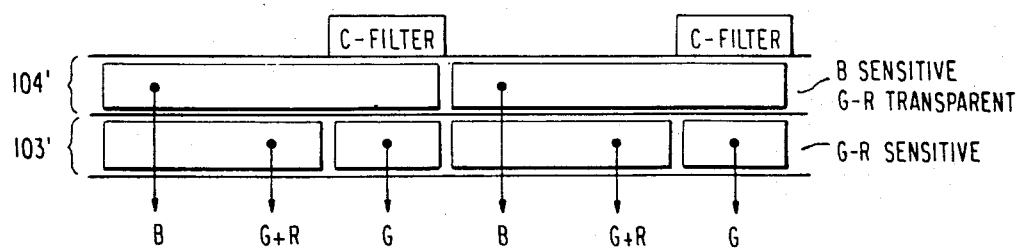

Instead of arranging the layers as shown in FIG. 7, the construction of FIG. 9 may be employed wherein the upper layer 104 is sensitive to only blue light and the lower layer 103 is sensitive to both green and red light. In this case, the monocolor filter 105 could be either magenta or cyan. As shown in FIG. 11(c), a magenta filter will result in three color signals B, G+R and R which can be combined to determine all colors. As shown in FIG. 11(d), a cyan filter results in signals B, G+R and G which can also be combined to determine all colors.

Figure 8:
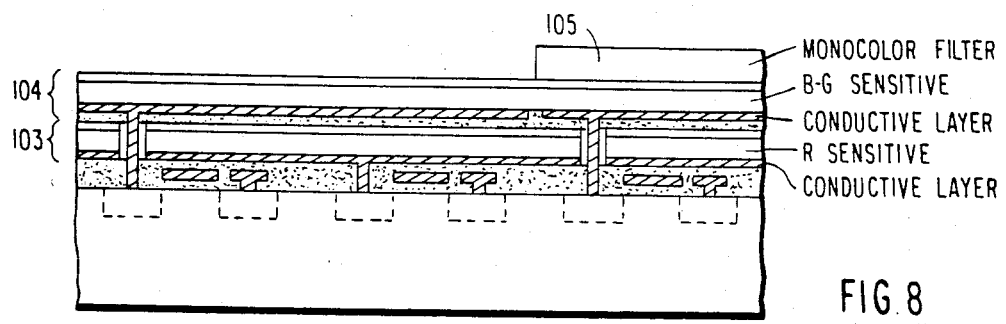
Figure 10:
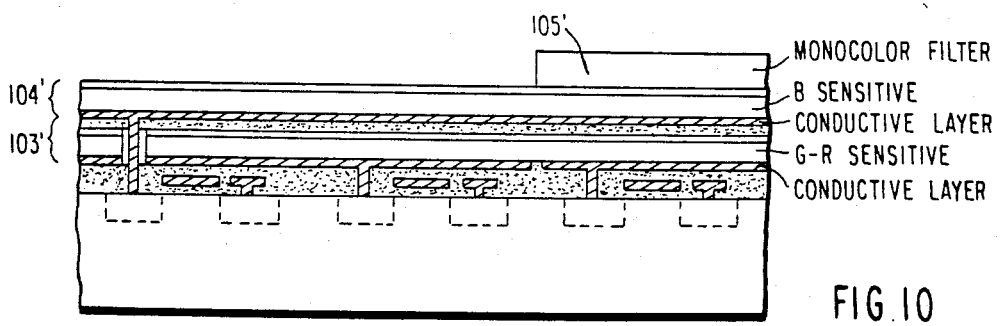

While the construction of FIG. 6 is particularly suitable for use with the switching elements of the European Pat. No. 0046396 and the Japanese Patent Application No. 56-133880, which will not permit the use of photosensitive diodes 5 and 5' in the layer 102, it should of course be appreciated that it could also be used with the switching elements disclosed in British Pat. No. 2,029,642. FIG. 8 shows such an arrangement. The embodiment of FIG. 8 is similar to that of FIG. 7 except that the electrodes sublayers are connected to the sources or drains of the switching elements. The operation of the embodiment of FIG. 8 will be illustrated in FIGS. 11(a) or 11(b) depending on the color of the monocolor 105. FIG. 10 is an alternative arrangement which differs from FIG. 8 only in that the layer 104 is sensitive to blue light while the layer 103 is sensitive to both green and red light. This embodiment will operate as illustrated in FIGS. 11(c) or 11(d), depending on the color of the monocolor filter 105.

The present solid-state color imager has been disclosed and described herein in what is considered to be the most practical and preferred embodiments. The reference to particular materials, particular terminologies, and the Particular sensitivities of the photosensitive layers and elements to particular wavelengths and colors of light is done merely to disclose preferred embodiments. It is recognized, however, that departures may be made therefrom which are within the scope of the invention and that modifications will occur to one skilled in the art upon reading the description.

What is claimed is:

1. A solid state imager, comprising:
   a plurality of switching elements;
   a first photosensitive layer sensitive to and absorptive of at least a first color and providing a first output;
   means for coupling said first output to a first of said switching elements;
   a second photosensitive layer receiving light through said first photosensitive layer, said second photosensitive layer having first and second portions and being sensitive to at least second and third colors different from said first color, and providing second and third outputs from said first and second portions, respectively;
   means for coupling said second and third outputs to a second and a third of said switching elements respectively; and
   a monocolor filter disposed over said second portion of said second photosensitive layer for blocking said second color whereby said third output is responsive to said third color.

2. A solid state imager, as claimed in claim 1, wherein said first photosensitive layer is sensitive to and absorptive of blue light and said second photosensitive layer is sensitive to green and red light.

3. A solid state imager, as claimed in claim 2, wherein said filter is a magenta filter.

4. A solid state imager, as claimed in claim 2, wherein said filter is a cyan filter.

5. A solid state imager, as claimed in claim 1, wherein said plurality of switching elements are comprised of metal oxide semiconductor (MOS) devices.

6. A solid state imager, as claimed in claim 1, wherein said plurality of switching elements are comprised of metal nitride oxide semiconductor (MOS) devices.

7. A solid state imager comprising:
   a plurality of switching elements;
   a first photosensitive layer having first and second portions and being sensitive to and absorptive of at least first and second colors and providing first and second outputs from said first and second portions, respectively;
   means for coupling said first and second outputs to a first and a second of said switching elements, respectively;
   a second photosensitive sensitive layer receiving light through said first photosensitive layer, said second photosensitive layer being sensitive to at least a third color different from said first and second colors and providing a third output;
   means for coupling said third output to a third of said switching elements; and
   a monocolor filter disposed over said second portion of said first photosensitive layer for blocking said first color whereby said second output is responsive to said second color.

8. A solid state imager, as claimed in claim 7, wherein said first photosensitive layer is sensitive to and absorptive of green and red light and said second photosensitive layer is sensitive to blue light.

9. A solid state imager, as claimed in claim 8, wherein said filter is a magenta filter.

10. A solid state imager, as claimed in claim 8, werein said filter is a yellow filter.

11. A solid state imager, as claimed in claim 7, wherein said plurality of switching elements are comprised of metal oxide semiconductor (MOS) devices.

12. A solid state imager, as claimed in claim 7, wherein said plurality of switching elements are comprised of metal nitride oxide semiconductor (MNOS) devices.

* * * * *